United States Patent
Liao et al.

(10) Patent No.: US 9,112,030 B2
(45) Date of Patent: Aug. 18, 2015

(54) EPITAXIAL STRUCTURE AND PROCESS THEREOF FOR NON-PLANAR TRANSISTOR

(71) Applicant: UNITED MICROELECTRONICS CORP., Hsin-Chu (TW)

(72) Inventors: Chin-I Liao, Tainan (TW); Chun-Yu Chen, Taichung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 67 days.

(21) Appl. No.: 14/070,596

(22) Filed: Nov. 4, 2013

(65) Prior Publication Data

US 2015/0123210 A1    May 7, 2015

(51) Int. Cl.
*H01L 29/78*  (2006.01)
*H01L 29/66*  (2006.01)
*H01L 29/16*  (2006.01)

(52) U.S. Cl.
CPC .............. *H01L 29/785* (2013.01); *H01L 29/16* (2013.01); *H01L 29/66795* (2013.01)

(58) Field of Classification Search
USPC ....................................................... 257/288
See application file for complete search history.

(56) References Cited

U.S. PATENT DOCUMENTS

| 7,863,163 | B2 | 1/2011 | Bauer | |
|---|---|---|---|---|
| 2010/0264497 | A1* | 10/2010 | Chang et al. | 257/393 |
| 2011/0079829 | A1* | 4/2011 | Lai et al. | 257/288 |
| 2011/0193141 | A1* | 8/2011 | Lin et al. | 257/255 |
| 2011/0210393 | A1* | 9/2011 | Chen et al. | 257/347 |
| 2011/0227162 | A1* | 9/2011 | Lin et al. | 257/368 |
| 2011/0278676 | A1 | 11/2011 | Cheng | |

OTHER PUBLICATIONS

Liao, Title of Invention: Semiconductor Device, U.S. Appl. No. 13/960,816, filed Aug. 7, 2013.

* cited by examiner

*Primary Examiner* — David Vu
*Assistant Examiner* — Jonathan Han
(74) *Attorney, Agent, or Firm* — Winston Hsu; Scott Margo

(57) ABSTRACT

An epitaxial structure for a non-planar transistor is provided. A substrate has a fin-shaped structure. A gate is disposed across the fin-shaped structure. A silicon germanium epitaxial structure is disposed on the fin-shaped structure beside the gate, wherein the silicon germanium epitaxial structure has 4 <1,1,1> surfaces and its aspect ratio of width and thickness is at a range of 1:1~1.3. A method for forming said epitaxial structure is also provided.

17 Claims, 5 Drawing Sheets

EPITAXIAL STRUCTURE AND PROCESS THEREOF FOR NON-PLANAR TRANSISTOR

BACKGROUND OF THE INVENTION

1. Field of the Invention

The present invention relates generally to an epitaxial structure and process thereof for a non-planar transistor, and more specifically to an epitaxial structure and process thereof for a non-planar transistor, which has 4<1,1,1> surfaces.

2. Description of the Prior Art

For decades, chip manufacturers have been making metal-oxide-semiconductor (MOS) transistors faster by making them smaller. As semiconductor processes advance to the very deep sub-micron era such as 65 nm node or beyond, how to increase the driving current for MOS transistors has become a critical issue. In order to improve device performance, crystal strain technology has been developed. Crystal strain technology is becoming more and more attractive as a means for getting better performance in the field of MOS transistor fabrication. Putting a strain on a semiconductor crystal alters the speed at which charges move through that crystal. Strain makes MOS transistors work better by enabling electrical charges, such as electrons, to pass more easily through the silicon lattice of the gate channel. Attempts have been made to use a strained silicon layer, which is grown epitaxially on a silicon substrate with a silicon germanium (SiGe) epitaxial structure or a silicon carbide (SiC) epitaxial structure disposed in between. In this type of MOS transistor, a biaxial compressive or tensile strain occurs in the epitaxy silicon layer due to the silicon germanium or silicon carbide having a larger or smaller lattice constant than silicon; as a result, the band structure alters, and the carrier mobility increases. This enhances the speed performance of the MOS transistors.

With increasing miniaturization of semiconductor devices, various multi-gate MOSFET devices such as fin-field effect transistor devices have been developed. The multi-gate MOSFET is advantageous for the following reasons. Manufacturing processes of multi-gate MOSFET devices can be integrated into traditional logic device processes, and thus are more compatible. In addition, since the three-dimensional structure of the multi-gate MOSFET increases the overlapping area between the gate and the substrate, the channel region is controlled more effectively. This therefore reduces a drain-induced barrier lowering (DIBL) effect and a short channel effect. Moreover, the channel region is longer for the same gate length, which increases the current between the source and the drain.

Due to the above advantages of the epitaxy technology and the multi-gate MOSFET, attempts have been made in the current industry to integrate epitaxy technology with a multi-gate MOSFET to achieve the advantages of both.

SUMMARY OF THE INVENTION

The present invention provides an epitaxial structure and process thereof for a non-planar transistor, which has 4 <1,1,1> surfaces with an aspect ratio of width and thickness at a range of 1:1~1.3 by applying a process having silane ($SiH_4$), germane ($GeH_4$), diborane ($B_2H_6$), hydrogen ($H_2$) and hydrogen chloride (HCl) gases imported.

The present invention provides an epitaxial structure including a substrate, a gate and a silicon germanium epitaxial structure for a non-planar transistor. The substrate has a fin-shaped structure. The gate is disposed across the fin-shaped structure. The silicon germanium epitaxial structure is disposed on the fin-shaped structure beside the gate, wherein the silicon germanium epitaxial structure has 4 <1,1,1> surfaces and its aspect ratio of width and thickness is in a range of 1:1~1.3.

The present invention provides an epitaxial process including the following steps for a non-planar transistor. A substrate having a fin-shaped structure is provided. A gate is formed across the fin-shaped structure. An epitaxial process containing silane ($SiH_4$), germane ($GeH_4$), diborane ($B_2H_6$), hydrogen ($H_2$) and hydrogen chloride (HCl) gases is performed to form a silicon germanium epitaxial structure on the fin-shaped structure beside the gate.

The present invention thereby provides an epitaxial structure and process thereof for a non-planar transistor, which forms a silicon germanium epitaxial structure on a fin-shaped structure beside a gate via an epitaxial process containing silane ($SiH_4$), germane ($GeH_4$), diborane ($B_2H_6$), hydrogen ($H_2$) and hydrogen chloride (HCl) gases. The silicon germanium epitaxial structure having at least 4 <1,1,1> surfaces and its aspect ratio of width and thickness in a range of 1:1~1.3 is formed. The uniform shape and distribution of the silicon germanium epitaxial structures enable the performances of epitaxial structure to be improved and precisely controlled. The silicon germanium epitaxial structures will not merge together to cause a short circuit, especially while forming a non-planar transistor under nano-degrees.

These and other objectives of the present invention will no doubt become obvious to those of ordinary skill in the art after reading the following detailed description of the preferred embodiment that is illustrated in the various figures and drawings.

DETAILED DESCRIPTION

Figure 6:
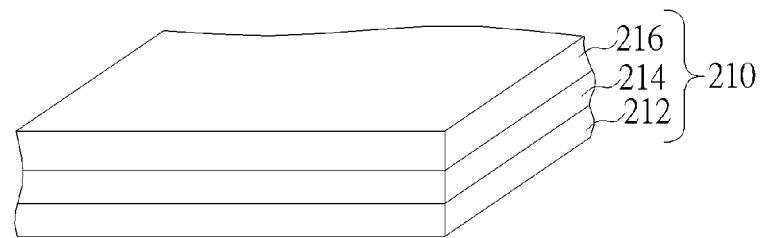
FIGS. 6-7 schematically depict cross-sectional views of an epitaxial process for a non-planar transistor according to a second embodiment of the present invention.
Figure 7:
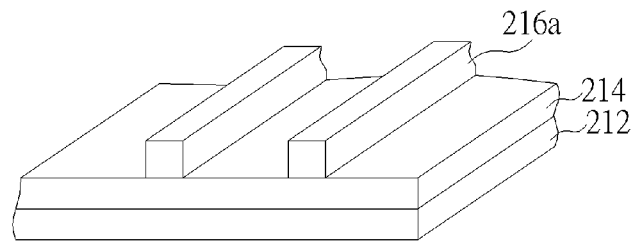

FIGS. 1-5 schematically depict cross-sectional views of an epitaxial process for a non-planar transistor according to a first embodiment of the present invention. FIGS. 6-7 schematically depict cross-sectional views of an epitaxial process for a non-planar transistor according to a second embodiment of the present invention. A silicon substrate is applied in the first embodiment of FIGS. 1-5 while a silicon-on-insulator substrate is applied in the second embodiment of FIGS. 6-7.

Figure 1:
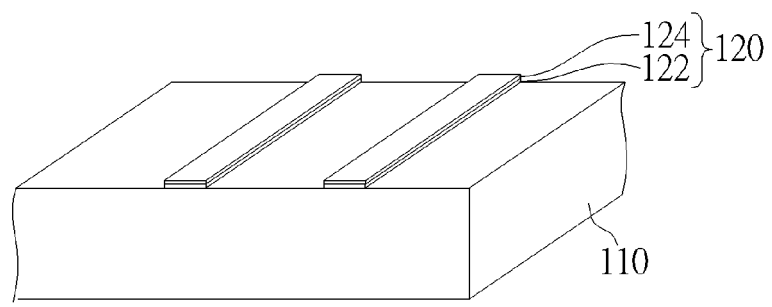
FIGS. 1-5 schematically depict cross-sectional views of an epitaxial process for a non-planar transistor according to a first embodiment of the present invention.
Figure 2:
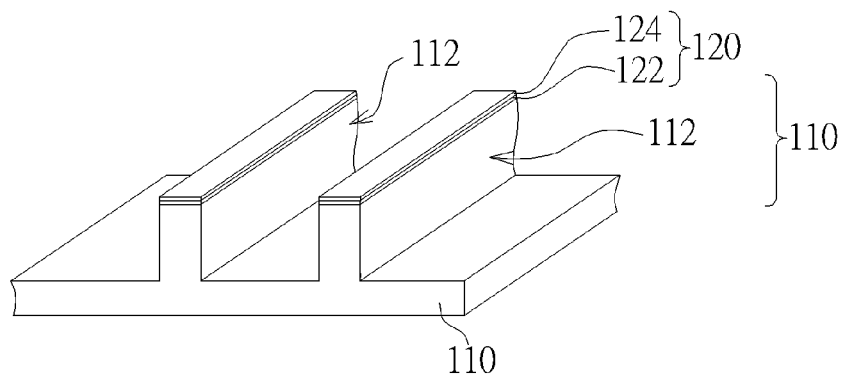
Figure 3:
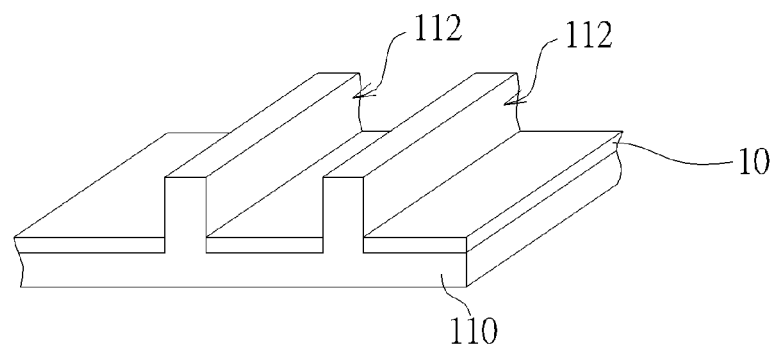

In the first embodiment, fin-shaped structures formed in a silicon substrate, and an isolation structure formed between the fin-shaped structures, are shown in FIGS. 1-3. As shown in FIG. 1, a substrate 110 is provided, wherein the substrate 110 is a silicon substrate in this embodiment, as an example. A patterned mask 120 is formed on the substrate 110, wherein the patterned mask 120 includes a patterned pad oxide 122 and a patterned nitride layer 124, which exposes a part of the substrate 110, but is not limited thereto. The patterned mask 120 may be a nitride layer or an oxide layer, etc., depending upon requirements. The method for forming the patterned mask 120 may be, but is not limited to, the following. A mask layer (not shown) is formed to entirely cover the substrate 110, wherein the mask layer includes a pad oxide layer (not shown) and a nitride layer (not shown) located on the pad oxide layer. A photolithography process (not shown) is performed to pattern the mask layer for forming the patterned pad oxide layer 122 and the patterned nitride layer 124.

As shown in FIG. 2, the patterns of the patterned pad oxide layer 122 and the patterned nitride layer 124 are transferred into the substrate 110 and two fin-shaped structures 112 are thereby formed in the substrate 110. In another case, the fin-shaped structures 112 may be formed by a sidewall image transfer process (SIT), etc.

As shown in FIG. 3, an isolation structure 10 is formed between the fin-shaped structures 112 by performing processes such as a depositing process and an etching back process. In this embodiment, the isolation structure 10 is a shallow trench isolation structure, which is formed by a shallow trench isolation process, but it is not limited thereto. In another embodiment, the isolation structure 10 may be another isolation structure formed by oxide, etc. Thus, two fin-shaped structures 112 are formed in the substrate 110, and the isolation structure 10 is formed on the substrate 100 between the fin-shaped structures 112. In this embodiment, the patterned pad oxide layer 122 and the patterned nitride layer 124 are then removed for forming a tri-gate MOSFET. In another embodiment, the patterned pad oxide layer 122 and the patterned nitride layer 124 may remain for forming a fin field-effect transistor.

In addition, the second embodiment, which includes fin-shaped structures formed in a silicon-on insulator substrate, is presented and is shown in FIGS. 6-7. As shown in FIG. 6, a silicon-on-insulator substrate 210 is provided, which includes a substrate 212, a bottom oxide layer 214 located on the substrate 212, and a silicon layer 216 located on the bottom oxide layer 214. As shown in FIG. 7, the silicon layer 216 is patterned to form two fin-shaped structures 216a while exposing a part of the bottom oxide layer 214 between the fin-shaped structures 216a. This means the two fin-shaped structures 216a can be formed on the substrate 212, and one isolation structure (the bottom oxide layer 214) can be formed between the fin-shaped structures 216a (the exposed part of the bottom oxide layer 214) and under the fin-shaped structures 216a.

The difference between the first embodiment shown in FIGS. 1-3 and the second embodiment shown in FIGS. 6-7 is: the isolation structure 10 formed on the silicon substrate 110 is only located between the fin-shaped structures 112 (as shown in FIG. 3), but the bottom oxide layer 214 formed by the silicon-on-insulator substrate 210 is not only located between the fin-shaped structures 216a but also located below the fin-shaped structures 216a. This difference does not affect the later semiconductor processes of the present invention, however, and said processes can be chosen according to practical needs.

Figure 4:
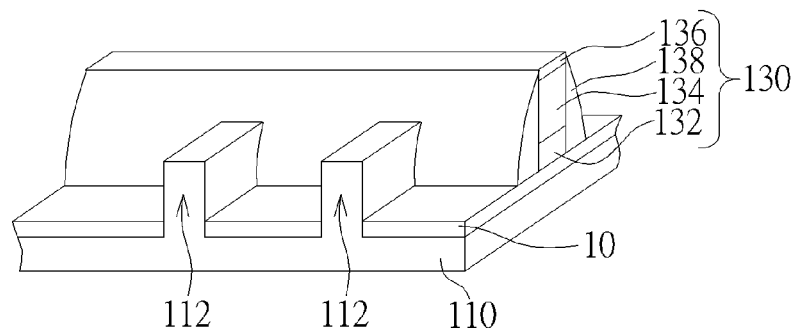

As shown in FIG. 4, a gate structure 130 is formed across a part of the isolation structure 10 and a part of the fin-shaped structures 112. The forming process of the gate structure 130 may include sequential depositing and patterning processes, thereby the gate structure 130 may include a gate dielectric layer 132 on a part of the isolation structure 10 and apart of the fin-shaped structures 112, a gate electrode 134 on the gate dielectric layer 132, a cap layer 136 on the gate electrode 134, and a spacer 138 beside the gate dielectric layer 132, the gate electrode 134, and the cap layer 136. The forming methods of these materials are known in the art, and are not described herein.

Figure 5:
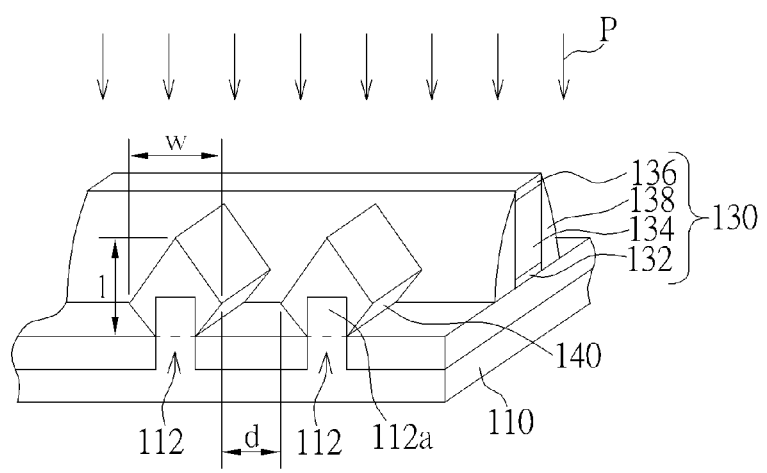

As shown in FIG. 5, an epitaxial process P is performed to form epitaxial structures 140 beside the gate structure 130. The epitaxial structures 140 are formed on the fin-shaped structures 112 without the gate structure 130 covering thereon. More precisely, each of the epitaxial structures 140 covers the top part 112a of each of the fin-shaped structure 112. In this embodiment, the epitaxial structures 140 include silicon germanium epitaxial structures, but are not limited thereto.

Figure 8:
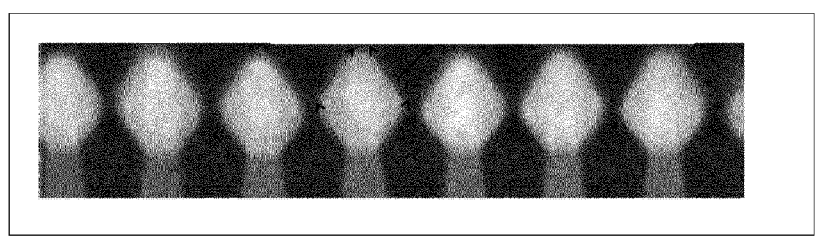
FIG. 8 is a cross-sectional view of an epitaxial structure for a non-planar transistor illustrated in FIG. 5 applying transmission electron microscopy (TEM).

The epitaxial process P contains silane ($SiH_4$), germane ($GeH_4$), diborane ($B_2H_6$), hydrogen ($H_2$) and hydrogen chloride (HCl) gases, so that the silicon germanium epitaxial structures on the fin-shaped structures 112 beside the gate 130 can be formed. It is emphasized that, due to the epitaxial process P containing silane ($SiH_4$) without other gases such as dichlorosilane, the growing in the direction of <1,1,1> and <1,1,0> can be slower than when using gases such as dichlorosilane. Therefore, the silicon germanium epitaxial structures can have 4 <1,1,1> surfaces. Preferably, the surfaces of the silicon germanium epitaxial structures are all <1,1,1> surfaces. Since the epitaxial process P contains silane ($SiH_4$), germane ($GeH_4$), diborane ($B_2H_6$), hydrogen ($H_2$) and hydrogen chloride (HCl) gases, the epitaxial structures 140 are formed uniformly, meaning the epitaxial structures 140 all have the same shapes with the same spacings d between them. Due to the uniform shape and distribution of the epitaxial structures 140, the performances of epitaxial structures 140 can be improved and precisely controlled, and the epitaxial structures 140 will not merge together to cause a short circuit. This is shown in FIG. 8, which is a cross-sectional view of an epitaxial structure for a non-planar transistor illustrated in FIG. 5 applying transmission electron microscopy (TEM).

In a preferred embodiment, the ratio of silane, germane, diborane, hydrogen chloride, hydrogen imported while performing the epitaxial process P is at a range of 1:(2.6-4.3):(6.4-9.3):(0.8-1.5):(112-500). Therefore, the aspect ratio of width w and thickness 1 of the epitaxial structure 140 can be controlled to be at a range of 1:1~1.3. The epitaxial structures 140 having desired advantages for a formed non-planar transistor can thereby be obtained. For example, the width w of the epitaxial structures 140 is 422 angstroms while the thickness 1 of the epitaxial structures 140 is 476 angstroms. It is noted that the thickness 1 of the epitaxial structures 140 should be less than 500 angstroms.

Figure 9:
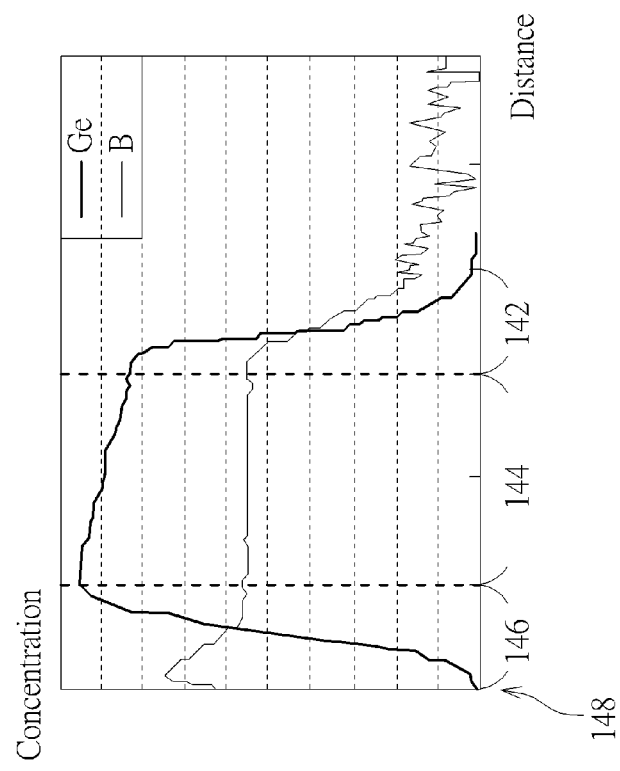
FIG. 9 is a curve diagram of ingredient distributions in an epitaxial structure for the non-planar transistor illustrated in FIG. 5.
Figure 9:
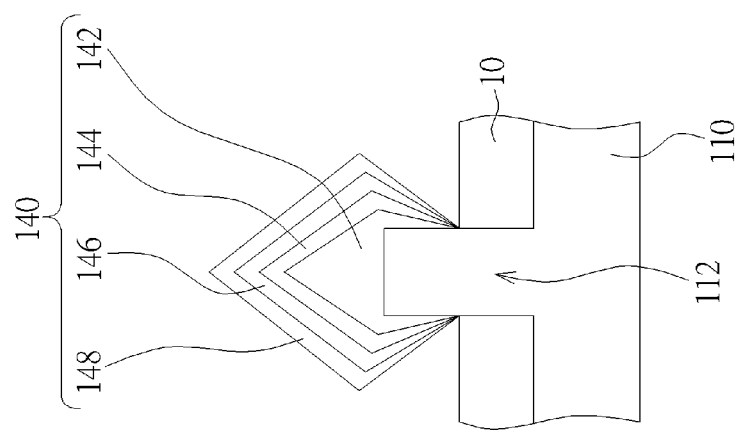

Furthermore, each of the epitaxial structures 140 may include multiple layers from the inner layer to the outer layer. FIG. 9 is a curve diagram of ingredient distributions in an epitaxial structure for the non-planar transistor shown in FIG. 5. As shown in FIG. 9, each of the epitaxial structures 140 may sequentially include an undoped silicon germanium layer 142, a bulk silicon germanium layer 144, a linear silicon germanium layer 146 and a silicon cap layer 148 from the inner layer to the outer layer. The undoped silicon germanium layer 142 may have a germanium concentration at a range of 30~40% and a thickness at a range of 30~140 angstroms. The bulk silicon germanium layer 144 may have a germanium concentration at a range of 40~50% and a thickness at a range of 200~400 angstroms. The linear silicon germanium layer 146 may have a germanium concentration at a range of 0~50% and a thickness at a range of 20~100 angstroms. The silicon cap layer 148 may have a thickness at a range of 50~100 angstroms.

Preferably, the epitaxial structures 140 are formed in-situ; the bulk silicon germanium layer 144 is formed at a processing temperature of 500~600° C.; the silicon cap layer 148 is formed at a processing temperature of 600~750° C.; and the epitaxial structures 140 are formed at a processing pressure of 1~300 millitorrs, meaning that better performances and processing throughput can be obtained. The processing temperature of the bulk silicon germanium layer 144 is lower than 1000° C., and thus can prevent the bulk silicon germanium layer 144 from being crushed.

The bulk silicon germanium layer 144 has a linear distribution of germanium concentration, and the maximum germanium concentration of the bulk silicon germanium layer 144 is preferably at the outer surface of the bulk silicon germanium layer 144; that is, the maximum germanium concentration of the bulk silicon germanium layer 144 occurs at the interface of the linear silicon germanium layer 146 and the bulk silicon germanium layer 144. Furthermore, the linear silicon germanium layer 146 has a linear germanium concentration decreasing from the bulk silicon germanium layer 144 to the silicon cap layer 148. Preferably, the linear silicon germanium layer 146 has a germanium concentration distributed at a concentration of 50% to 0% from the inner layer to the outer layer, and the silicon cap layer 148 is a pure silicon cap layer. Due to this germanium concentration and a smooth or gradient germanium concentration distribution, dislocation of the undoped silicon germanium layer 142, the bulk silicon germanium layer 144, the linear silicon germanium layer 146 and the silicon cap layer 148 can be prevented. The bulk silicon germanium layer 144 may further be doped with boron and has a uniform boron distribution, which provides it with steady electrical properties. Above all, the germanium concentration may represent the germanium concentration by moles.

To summarize, the present invention provides an epitaxial structure and a process thereof for a non-planar transistor, which forms an epitaxial structure on a fin-shaped structure beside a gate via an epitaxial process containing silane (SiH$_4$), germane (GeH$_4$), diborane (B$_2$H$_6$), hydrogen (H$_2$) and hydrogen chloride (HCl) gases. The epitaxial structure having at least 4 <1,1,1> surfaces and its aspect ratio of width and thickness at a range of 1:1~1.3 can thereby be formed. The uniform shape and distribution of the epitaxial structures enable the performances of the epitaxial structures to be improved and precisely controlled. Further, the epitaxial structures will not merge together to cause a short circuit, especially while forming a non-planar transistor under nanodegrees.

The epitaxial structure is a silicon germanium epitaxial structure, and the epitaxial process has the ratio of silane, germane, diborane, hydrogen chloride, and hydrogen imported while performing the epitaxial process at a range of 1:(2.6-4.3):(6.4-9.3):(0.8-1.5):(112-500). The thickness of the epitaxial structure can be less than 500 angstroms. The processing temperature of the epitaxial structure is preferably in a range of 500~750° C., but not higher than 1000° C.; and the processing pressure of the epitaxial structure is preferably in a range of 1~300 torrs, to thereby achieve high processing throughput without structural crushing.

The epitaxial structure may include multiple layers, and the multiple layers may sequentially include an undoped silicon germanium layer, a bulk silicon germanium layer, a linear silicon germanium layer and a silicon cap layer from the inner layer to the outer layer. More precisely, the bulk silicon germanium layer has a linear distribution of germanium concentration and the maximum germanium concentration of the bulk silicon germanium layer is at the outer surface of the bulk silicon germanium layer. The bulk silicon germanium layer may be doped with boron, and preferably has a uniform boron distribution. The linear silicon germanium layer has a linear germanium concentration decreasing from the bulk silicon germanium layer to the silicon cap layer. Preferably, the linear silicon germanium layer has a germanium concentration which is distributed at a concentration of 50% to 0% from the inner layer to the outer layer, and the silicon cap layer is a pure silicon cap layer. According to these gradient concentration distributions, dislocation of these layers can be prevented. Steady performances can be achieved due to a smooth and suitable concentration distribution.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An epitaxial structure for a non-planar transistor, comprising:
a substrate having a fin-shaped structure;
a gate disposed across the fin-shaped structure; and
a silicon germanium epitaxial structure disposed on the fin-shaped structure beside the gate, wherein the silicon germanium epitaxial structure has 4 <1,1,1> surfaces and its aspect ratio of width and thickness is in a range of 1:1~1.3, wherein the silicon germanium epitaxial structure sequentially comprises an undoped silicon germanium layer, a bulk silicon germanium layer, a linear silicon germanium layer and a silicon cap layer from an inner layer to an outer layer.

2. The epitaxial structure for a non-planar transistor according to claim 1, wherein the silicon germanium epitaxial structure covers the top part of the fin-shaped structure.

3. The epitaxial structure for a non-planar transistor according to claim 1, wherein the bulk silicon germanium layer has a linear distribution of germanium concentration.

4. The epitaxial structure for a non-planar transistor according to claim 3, wherein the maximum germanium concentration of the bulk silicon germanium layer is at an outer surface of the bulk silicon germanium layer.

5. The epitaxial structure for a non-planar transistor according to claim 1, wherein the bulk silicon germanium layer has a uniform boron distribution.

6. The epitaxial structure for a non-planar transistor according to claim 1, wherein the linear silicon germanium layer has a germanium concentration in a range of 0~50%.

7. The epitaxial structure for a non-planar transistor according to claim 6, wherein the linear silicon germanium layer has a germanium concentration distributed in a concentration of 50% to 0% from the inner layer to the outer layer and the silicon cap layer is a pure silicon cap layer.

8. The epitaxial structure for a non-planar transistor according to claim 1, wherein the linear silicon germanium layer has a linear germanium concentration decreasing from the bulk silicon germanium layer to the silicon cap layer.

9. The epitaxial structure for a non-planar transistor according to claim 1, wherein the thickness of the silicon germanium epitaxial structure is less than 500 angstroms.

10. An epitaxial process for a non-planar transistor, comprising:
providing a substrate having a fin-shaped structure;
forming a gate across the fin-shaped structure; and
performing an epitaxial process containing silane (SiH4), germane (GeH4), diborane (B2H6), hydrogen (H2) and hydrogen chloride (HCl) gases to form a silicon germanium epitaxial structure on the fin-shaped structure beside the gate, wherein the silicon germanium epitaxial structure sequentially comprises an undoped silicon germanium layer, a bulk silicon germanium layer, a linear silicon germanium layer and a silicon cap layer from an inner layer to an outer layer.

11. The epitaxial process for a non-planar transistor according to claim 10, wherein the silicon germanium epitaxial structure has 4 <1,1,1> surfaces.

12. The epitaxial process for a non-planar transistor according to claim 10, wherein the aspect ratio of width and thickness of the silicon germanium epitaxial structure is in a range of 1:1~1.3.

13. The epitaxial process for a non-planar transistor according to claim 10, wherein the ratio of silane, germane, diborane, hydrogen chloride, hydrogen is in a range of 1: (2.6-4.3): (6.4-9.3): (0.8-1.5): (112-500).

14. The epitaxial process for a non-planar transistor according to claim 10, wherein the silicon germanium epitaxial structure is formed in-situ.

15. The epitaxial process for a non-planar transistor according to claim 10, wherein the bulk silicon germanium layer is formed at a processing temperature of 500~600° C.

16. The epitaxial process for a non-planar transistor according to claim 10, wherein the silicon cap layer is formed at a processing temperature of 600~750° C.

17. The epitaxial process for a non-planar transistor according to claim 10, wherein the silicon germanium epitaxial structure is formed at a processing pressure of 1~300 torrs.

* * * * *